United States Patent [19]

Kanai et al.

[11] Patent Number: 4,868,014
[45] Date of Patent: Sep. 19, 1989

[54] METHOD FOR FORMING THIN FILM MULTI-LAYER STRUCTURE MEMBER

[75] Inventors: Masahiro Kanai, Tokyo; Masaaki Hirooka, Toride; Jun-Ichi Hanna; Isamu Shimizu, both of Yokohama, all of Japan

[73] Assignee: Canon Kabushiki Kaisha, Tokyo, Japan

[21] Appl. No.: 3,054

[22] Filed: Jan. 13, 1987

[30] Foreign Application Priority Data

Jan. 14, 1986 [JP] Japan .................. 61-004367
Jan. 14, 1986 [JP] Japan .................. 61-004368

[51] Int. Cl.⁴ .............................. B05D 3/06
[52] U.S. Cl. .................. 427/248.1; 427/255; 427/255.1; 427/255.2; 427/255.3; 427/255.7; 437/225
[58] Field of Search ............... 427/86, 85, 248.1, 255, 427/255.1, 255.2, 255.3, 255.7, 87; 437/225

[56] References Cited

U.S. PATENT DOCUMENTS

| | | | |
|---|---|---|---|
| 4,217,374 | 8/1980 | Ovshinsky et al. | 427/86 |
| 4,226,898 | 10/1980 | Ovshinsky et al. | 427/86 |
| 4,504,518 | 3/1985 | Ovshinsky et al. | 427/86 |
| 4,522,663 | 6/1985 | Ovshinsky et al. | 427/86 |
| 4,554,180 | 11/1985 | Hirooka | 427/248.1 |
| 4,568,626 | 2/1986 | Ogawa | 427/39 |
| 4,615,905 | 10/1986 | Ovshinsky et al. | 427/86 |
| 4,637,895 | 1/1987 | Ovshinsky et al. | 427/39 |
| 4,657,777 | 4/1987 | Hirooka et al. | 427/39 |
| 4,664,937 | 5/1987 | Ovshinsky et al. | 427/86 |

FOREIGN PATENT DOCUMENTS

| | | | |
|---|---|---|---|
| 2038086 | 7/1980 | United Kingdom | 427/87 |
| 2148328 | 5/1985 | United Kingdom | 427/248.1 |

Primary Examiner—Norman Morgenstern
Assistant Examiner—Sadie Childs
Attorney, Agent, or Firm—Fitzpatrick, Cella, Harper & Scinto

[57] ABSTRACT

A method for forming a thin film multi-layer structure member having at least one of at least one kind of a semiconductor thin film controlled in valence electron and a semiconductor thin film regulated in band gap comprises the step of forming at least one layer of the semiconductor thin films on a substrate by energizing a heat-generating member constituted of either a single substance or an alloy of a transition metal element having the catalystic effect provided in a film forming space to effect heat generation, bringing a starting material (A) for deposited film formation containing at least one element of halogens and hydrogen in the molecule and a compound (B) containing an element which becomes at least one of the valence electron controller and the band gap regulator into contact with the heat-generating member under heat generating state to cause a thermal dissociation reaction to effect activation, thereby forming a precursor (X) which becomes the starting material for deposited film formation and using the precursor (X) as the feeding source for the constituent element of the thin film, and the step of forming at least one layer of other thin films by introducing a gaseous starting material (a) for deposited film formation and a gaseous halogenic oxidizing agent having the property of oxidation action for the starting material (a) into a reaction space to effect contact therebetween to thereby form chemically a plural number of precursors including precursors under excited state and using at least one precursor of the precursors as the feeding source for the constituent element of the deposited film.

10 Claims, 3 Drawing Sheets

METHOD FOR FORMING THIN FILM MULTI-LAYER STRUCTURE MEMBER

BACKGROUND OF THE INVENTION

1. Field of the Invention

This invention relates to a method for formation of a thin film multi-layer structure member for electronic devices such as thin film semiconductor devices, photovoltaic devices, photosensitive devices for electrophotography.

2. Related Background Art

In the prior art, for functional films, especially amorphous or polycrystalline semiconductor films individually suitable film forming methods have been employed from the standpoint of desired physical characteristics, uses, etc.

For example, for formation of silicon deposited films such as amorphous or polycrystalline non-single crystalline silicon which are optionally compensated for lone pair electrons with a compensating agent such as hydrogen atoms (H) or halogen atoms (X), etc., (hereinafter abbreviated as "NON-Si (H,X)", particularly "A-Si (H,X)" when indicating an amorphous silicon and "poly-Si (H,X)" when indicating a polycrystalline silicon) (the so-called microcrystalline silicon is included within the category of A-Si (H,X) as a matter of course), there have been attempted the vacuum vapor deposition method, the plasma CVD method, the thermal CVD method, the reactive sputtering method, the ion plating method, the optical CVD method, etc. Generally, the plasma CVD method has been widely used and industrialized.

However, the reaction process in formation of a silicon-based deposited film according to the plasma CVD method which has been generalized in the prior art is considerably complicated as compared with the other CVD methods of the prior art, and its reaction mechanism involves not a few ambiguous points. Also, there are a large number of parameters for formation of a deposited film (for example, substrate temperature, flow rate and flow rate ratio of the introduced gases, pressure during formation, high frequency power, electrode structure, structure of the reaction vessel, speed of evacuation, plasma generating system, etc.). By combination of such a large number of parameters, the plasma may sometimes become unstable state, whereby marked deleterious influences were exerted frequently on the deposited film formed. Besides, the parameters characteristics of the device must be selected for each device and therefore under the present situation it has been difficult to generalize the production conditions.

On the other hand, for the silicon-based deposited film to exhibit sufficiently satisfactory electric and optical characteristics for respective uses, it is now accepted that the best to form it is according to the plasma CVD method.

However, depending on the application use of the silicon-based deposited film, bulk production with reproducibility must be attempted with full satisfaction of enlargement of area, uniformity of film thickness as well as uniformity of film quality, and therefore in formation of a silicon-based deposited film according to the plasma CVD method, enormous installation investment is required for a bulk production device and also management items for such bulk production become complicated, with management tolerance being narrow and the control of the device being severe. These are pointed as the problems to be improved in the future.

Also, in the case of the plasma CVD method, since plasma is directly generated by high frequency or microwave, etc., in the deposition space in which a substrate on which film is formed in arranged, electrons or a number of ion species generated may cause damage to the film in the film forming process to cause lowering in film quality or non-uniformization of film quality.

Particularly, in the case of a semiconductor device having a multi-layer structure, the state of the interfaces between the respective layers has been known to affect greatly the characteristics of the device. Accordingly, for example, in the case of preparing a photosensitive member for electrophotography, since starting gas species, flow rates and plasma discharging intensities, etc. differ largely from layer to layer during deposition of longer wavelength-light absorbing layer, charge injection preventing layer, photosensitive layer, surface protective layer, etc. on a substrate, complete gas exchange is effected with discharging being stopped, a varied layer is provided which is formed by varying gradually the gas species, flow rate and plasma discharging intensity, or alternatively the respective deposited films are formed in separated deposition chambers, thereby attempting to improve the device characteristics through improvement of the state of the interfaces between the respective deposited films. However, according to any of these methods, no satisfactory change or improvement of the device characteristics could be recognized.

As described above, in formation of silicon-based deposited film, the points to be solved still remain, and it has been earnestly desired to develop a method for forming a deposited film which is capable of bulk production by attempting to effect conservation of energy by means of a device of low cost, while maintaining the characteristics as well as uniformity which are practically available.

Particularly, it has been desired earnestly to develop a formation method which can improve the interface state of a thin film multi-layer structure member such as thin film transistors, photovoltaic devices, photosensitive members for electrophotography, etc. and a method for forming a multi-layer structure member having good interface state which can improve the characteristics of the devices.

SUMMARY OF THE INVENTION

An object of the present invention is to provide a novel method for forming thin film multi-layer structure member without use of the formation method of the prior art simultaneously with removal of the drawbacks of the methods for forming a thin film multi-layer structure member as described above.

Another object of the present invention is to provide a method for forming a thin film multi-layer structure having at least one layer of a semiconducting deposited film having at least one band gap regulator or valence electron controller added therein and having uniform characteristics over large area with easy management of film quality while effecting energy saving.

Still another object of the present invention is to provide a method for forming a thin film multi-layer structure member excellent in productivity, bulk productivity, having high quality and excellent physical properties such as electrical, optical and semiconducting properties, etc.

DESCRIPTION OF THE PREFERRED EMBODIMENTS

The method for forming a thin film multi-layer structure member according to the present invention is a method for forming a thin film multi-layer structure member having at least one of at least one kind of a semiconductor thin film controlled in valence electron and a semiconductor thin film regulated in band gap, which comprises the step of forming at least one layer of the semiconductor thin films on a substrate by energizing a heat-generating member constituted of either a single substance of a transition metal element having the catalytic effect or an alloy thereof provided in a film forming space to effect heat generation, bringing a starting material (A) for deposited film formation containing at least one element of halogens and hydrogen in the molecule and a compound (B) containing an element which becomes at least one of the valence electron controller and the band gap regulator into contact with the heat-generating member under heat generating state to cause a thermal dissociation reaction to effect activation, thereby forming a precursor (X) which becomes the starting material for deposited film formation and using the precursor (X) as the feeding source for the constituent element of the thin film, and the step of forming at least one layer of other thin films by introducing a gaseous starting material (a) for deposited film formation and a gaseous halogenic oxidizing agent having the property of oxidation action for the starting material (a) into a reaction space to effect contact therebetween to thereby form chemically a plural number of precursors including precursors under excited state and using at least one precursor of the precursors as the feeding source for the constituent element of the deposited film (hereinafter, this forming method is referred to as "FOCVD").

According to the method for formation of a thin film multi-layer structure member of the present invention, a thin film multi-layer structure member with good layer interface characteristics can be obtained, and formation of the respective deposited films can be done with simplification of management and bulk production as well as full satisfaction of uniformity of film thickness and uniformity of film quality simultaneously with conservation of energy, without requiring enormous installation investment for bulk production apparatus, and also the management items for its bulk production become clear to afford broad management tolerance and simple control of the device.

The above gaseous starting material (a) receives oxidizing action through chemical contact with a gaseous halogenic oxidizing agent and can be selected suitably as desired depending on the kind, the character-istics, use, etc., of the desired deposited film. In the present invention, the above gaseous starting material (a) and the gaseous halogenic oxidizing agent may be those which can be made gaseous when introduced into a reaction space to contact with each other, and they can be either liquid or solid as ordinary state.

When gaseous starting material (a) for thin film formation or a halogenic oxidizing agent is liquid or solid, they are introduced in gaseous state into the reaction space by performing bubbling with the use of carrie gas such as Ar, He, $N_2$, $H_2$, etc., optionally with application of heat.

During this operation, the partial pressures and mixing ratio of the above gaseous starting material (a) and the gaseous halogenic oxidizing agent may be set by controlling the flow rate of the carrier gas and the vapor pressures of the gaseous starting material (a) and the gaseous halogenic oxidizing agent.

As the starting material for thin film formation to be used in the present invention, for example, if tetrahedral type deposited films such as semiconducting or electrically insulating silicon-based deposited films or germanium-based deposited films, etc., are desired to be obtained, straight chain and branched chain silane compounds, cyclic silane compounds, chain germanium compounds, etc., may be employed as effective ones.

Specifically, examples of straight chain silane compounds may include $Si_nH_{2n+2}$ (n=1, 2, 3, 4, 5, 6, 7, 8), examples of branched chain silane compounds include $SiH_3SiH(SiH_3)SiH_2SiH_3$, examples of cyclic silane compounds include $Si_nH_{2n}$ (n=3, 4, 5, 6), and examples of chain germanium compounds include $Ge_mH_{2m+2}$ (m=1, 2, 3, 4, 5), etc. Otherwise, for example, if deposited films of tin are desired to be prepared, hydrogenated tin such as $SnH_4$, etc., may be employed as effective starting material.

Of course, these starting materials may be used either as a single kind or as a mixture of two or more kinds.

The halogenic oxidizing agent to be used in the present invention is made gaseous when introduced into the reaction space and at the same time has the property of effectively oxidizing the gaseous starting material (a) for formation of a deposited film introduced into the reaction space by mere chemical contact therewith, including halogenic gas such as $F_2$, $Cl_2$, $Br_2$, $I_2$, etc., and fluorine, chlorine, bromine, etc., under nascent state as effective ones.

These halogenic oxidizing agents are introduced into the reaction space under gaseous state together with the gas of the starting material (a) for formation of a deposited film as described above with desired flow rate and feeding pressure being given, wherein they are mixed with and collided against the above starting material (a) to be chemically contacted therewith, thereby oxidizing the above starting material (a) to generate efficiently a plural kinds of precursors containing precursors under excited state. Of the precursors under excited state and other precursors generated, at least one of them function as the feeding source for the constituent element of the deposited film formed.

The precursors generated may undergo decomposition or reaction to be converted to other precursors under excited state or to precursors under another excited state, or alternatively in their original forms, if desired, although releasing energy to contact the substrate surface arranged in a film forming space (A), spatially communicated with the reaction space, whereby a deposited film with a three-dimensional network structure is formed when the substrate surface temperature is relatively lower, or a deposited film with a crystalline structure is formed when the substrate surface temperature is relatively high.

In the present invention, so that the deposit film forming process may proceed smoothly to form a film of high quality and having desired physical characteristics, as the film forming factors, the kinds and combination of the starting material (a) and the halogenic oxidizing agent, mixing ratio of these, pressure during mixing, flow rate, the inner pressure in the film forming space, the flow types of the gases, the film forming temperature (substrate temperature and atmosphere temperature) are suitably selected as desired. These film forming factors are organically related to each other, and they are not determined individually but determined respectively under mutual relationships. In the present invention, the ratio of the gaseous starting material (a) for formation of a deposited film and the gaseous halogenic oxidizing agent introduced into the reaction space may be determined suitably as determined in relationship of the film forming factors related among the film forming factors as mentioned above, but it is preferably 1/20 to 100/1, more preferably 1/5 to 50/1 in terms of flow rate ratio introduced.

The pressure during mixing when introduced into the reaction space may be preferably higher in order to enhance the chemical contact between the above gaseous starting material (a) and the above gaseous halogenic oxidizing agent in probability, but it is better to determine the optimum value suitably as desired in view of the reactivity. Although the pressure during mixing may be determined as described above, each of the pressure during introduction may be preferably $1 \times 10^{-7}$ atm to 5 atm, more preferably $1 \times 10^{-6}$ atm to 2 atm.

The pressure within the film forming space, namely the pressure in the space in which the substrate for film formation on its surface is arranged may be set suitably as desired so that the precursors (E) under excited state generated in the reaction space and sometimes the precursors (D) formed as secondary products from said precursors (E) may contribute effectively to film formation.

The inner pressure in the film forming space, when the film forming space is continuous openly to the reaction space, can be controlled in relationship with the introduction pressures and flow rates of the gaseous starting material for formation of a deposited film and a gaseous halogenic oxidizing agent in the reaction space, for example, by application of a contrivance such as differential evacuation or use of a large scale evacuating device.

Alternatively, when the conductance at the connecting portion between the reaction space and the film forming space is small, the pressure in the film forming space can be controlled by providing an appropriate evacuating device in the film forming space and controlling the evacuation amount of the device.

On the other hand, when the reaction space and the film forming space are integrally made and the reaction position and the film forming position are only different in space, it is possible to effect differential evacuation or provide a large scale evacuating device having sufficient evacuating capacity as described above As described above, the pressure in the film forming space may be determined in the relationship with the introduction pressures of the gaseous starting material (a) and the gaseous halogenic oxidizing agent introduced into the reaction space, but it is preferably 0.001 Torr to 100 Torr, more preferably 0.01 Torr to 30 Torr, optimally 0.05 Torr to 10 Torr.

Figure 1:
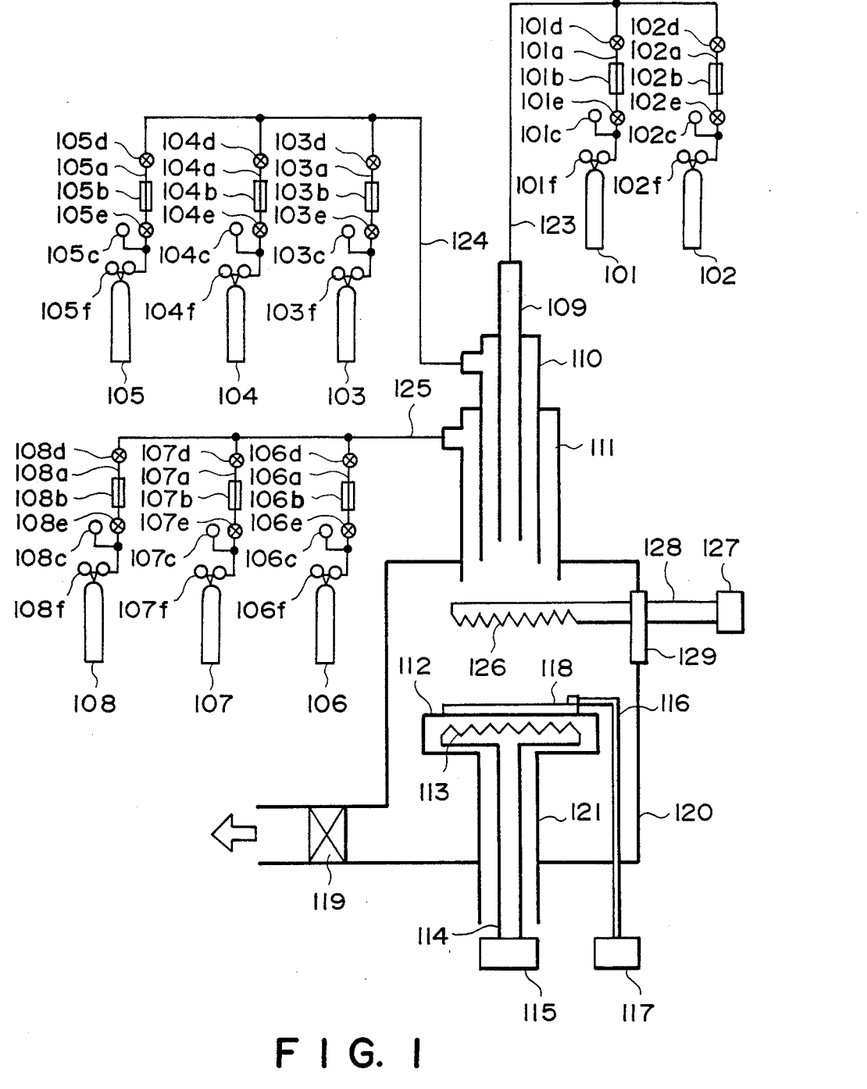
FIG. 1 illustrates schematically the constitution of an example of the film forming device for embodying the method of the present invention.

As for the flow type of the gases, it is necessary to design the flow type in view of the geometric arrangement of the gas introducing inlet, the substrate and the gas evacuating outlet so that the starting material (a) for formation of a deposited film and the halogenic oxidizing agent may be efficiently mixed during introduction of these into the reaction space, the above precursors (E) may be efficiently generated and film formation may be adequately done without trouble. A preferable example of the geometric arrangement is shown in FIG. 1, as described below.

As the substrate temperature (Ts) during film formation, it can be set suitably as desired individually depending on the gas species employed and the kinds and the required characteristics of the deposited film formed, but, in the case of obtaining an amorphous film, it is preferably from room temperature to 450° C., more preferably from 50° to 400° C. Particularly, in the case of forming a silicon deposited film with better semiconducting characteristics and photoconductive characteristics, etc., the substrate temperature (Ts) should desirably be made 70° to 350° C. On the other hand, in the case of obtaining a polycrystalline film, it should preferably be 200° to 700° C., more preferably 300° to 600° C.

As the atmosphere temperature (Tat) in the film forming space, it may be determined suitably as desired in relationship with the substrate temperature (Ts) so that the above precursors (E) generated and the above precursors (D) are not changed to unsuitable chemical species for film formation, and also the above precursors (E) may be efficiently generated.

In the film forming space for formation of a thin film controlled in valence electron in the present invention, in place of giving rise to plasma, a starting gas for formation of a deposited film containing at least one element of halogens and hydrogen in the molecule is introduced into the film forming space, and the gas is activated through the catalytic action of a heat-generating member comprising a single substance or alloy of a transition metal provided within the film forming space to form precursors (X) and optionally active species (Y) which become the starting material for formation of a deposited film. Since the deposited film is formed according to such procedure, the deposited film formed will not be badly affected by etching action or otherwise, for example, abnormal discharging action, etc., during film formation.

The above-mentioned precursors (X) which become the starting material for formation of the deposited film are formed by the thermal dissociation reaction with the use of a single substance or an alloy of a transition metal, and therefore, for example, radicals such as .H, :SiH$_2$, :SiF$_2$, :SiHF, etc., can be estimated to be the main starting materials, whereby the reaction mechanism becomes extremely simple.

Also, since no plasma is used in the film forming space, the parameters for formation of the deposited film are amounts of the starting gases for formation of deposited film, the temperatures of the heat-generating member and a substrate, the distance and the position of the heat-generating member from the substrate and the pressure, and therefore the conditions for formation of the deposited film can be easily controlled to form deposited films with reproducibility and bulk productivity.

The "precursor (X)" as mentioned in the present invention refers to one which can become the starting material for the deposited film to be formed. The "active species (Y)" refers to one which is responsible for the role of bringing the precursors under the state capable of forming a deposited film more efficiently by interacting chemically with the precursor to thereby give energy to the precursor or chemically reacting with the precursor. Accordingly, the active species (Y) may contain the constituent which becomes the constituent constituting the deposited film formed or not contain such constituent.

Further, since the precursors (X) and/or active species (Y) containing at least one element of halogens and hydrogen can be formed in the vicinity of the substrate through the catalytic action of a single substance or an alloy of a transition metal, it is possible to prevent polymerization mutually between precursors and conveying loss by adsorption of the precursors onto the conveying pipewall which are problems in the case of generating precursors in an activation space other than the film forming space, whereby utilization efficiency of the starting gas can be improved to great extent.

Also, since the means for activating the starting gas is a heat-generating member comprising a single substance or an alloy of a transition metal, it is possible to form a uniform deposited film even on a substrate with a complicated shape ranging from minute area to large area by controlling freely as desired the shape of the heat-generating member corresponding to the size of the film forming surface of the substrate.

Also, since the heat-generating member comprising a single substance or an alloy of a transition metal is located in the vicinity of the substrate, the life of the precursors (X) and/or active species (Y) formed from the starting gas is not particularly limited.

As the single substance or the alloy of a transition metal which becomes the heat-generating member to be used in the present invention, it is desirable to select one which will be mixed into the deposited film to be formed with difficulty through sublimation or scattering, and it is also necessary to select the activation conditions under which these are mixed into the deposited film with difficulty during activation by use of these.

Such materials may include metals and alloys of the elements of the fourth period or the fifth period or the sixth period of the periodic table. Among them, transition metals belonging to the group IV, V, VI, VII or VIII may be preferably used.

Specific examples may include Ti, Nb, V, Cr, Mo, W, Fe, Zr, Hf, Ta, Ni, Co, Rh, Pt, Pd, Au, Mn, Ag, Zn, Cd, Pd-Ag, Ni-Cr, and others.

In the present invention, the distance of the heat-generating member comprising a single substance or an alloy of a transition metal provided in the film forming space from the substrate may be preferably 1 to 200 mm, more preferably 2 to 50 mm, optimally 5 to 20 mm in view of prevention of damage of the substrate by heat or efficient migration of precursors (X) onto the substrate.

Also, in the present invention, the heat-generating temperature of the heat-generating member comprising a single substance or an alloy of a transition metal provided in the film forming space may be preferably 100° C. to 3000° C., more preferably 200° C. to 2500° C., optimally 500° C. to 2000° C.

The heat-generating member may be selected to be shaped in either one of line, filament, mesh, flat plate, hone/comb etc., whereby the cross-section of the precursors and/or active species formed can be changed to control the reaction between the precursors and the active species, and a uniform deposited film can be prepared corresponding to the substrate shape.

In the present invention, the starting material for formation of a deposited film containing at least one element of halogens and hydrogen in the molecule to be used for film formation may include compounds containing silicon as the main skeleton, compounds containing carbon as the main skeleton, compounds containing germanium as the main skeleton, and hydrogen, hydrogen fluoride, hydrogen chloride, hydrogen bromide, hydrogen iodide, etc.

These compounds may be used either individually alone or as a suitable combination, if desired.

As the compound containing silicon as the main skeleton, there may be employed, for example, chain or cyclic silane compounds and chain or cyclic silane compounds of which a part or all of the hydrogen atoms are substituted with halogen atoms. Specific examples may include $Si_nH_{2n+2}$ (n=1, 2, 3, 4, 5, 6, 7, 8) as straight chain silane compounds, $SiH_3SiH(SiH_3)SiH_2SiH_3$ as a branched chain silane compounds, $Si_nH_{2n}$ (n=3, 4, 5, 6) as cyclic silane compounds, and also chain halogenated silicon represented by $Si_uY_{2u+2}$ (u is an integer of 1 or more, Y is at least one element selected from F, Cl, Br and I), cyclic halogenated silicon represented by $Si_vY_{2v}$ (v is an integer of 3 or more, and Y has the meaning as mentioned above), chain or cyclic silicon compounds represented by $Si_uH_xY_y$ (u and Y have the above meanings, x+y=2u or 2u+2).

Specific examples may include gaseous or readily gasifiable compounds such as $SiF_4$, $(SiF_2)_5$, $(SiF_2)_6$, $(SiF_2)_4$, $Si_2F_6$, $Si_3F_8$, $SiHF_3$, $SiH_2F_2$, $SiCl_4$, $(SiCl_2)_5$, $SiBr_4$, $(SiBr_2)_5$, $Si_2Cl_6$, $Si_2Br_6$, $SiHCl_3$, $SiH_2Cl_2$, $SiHBr_3$, $SiHI_3$, $Si_2H_3F_3$, $Si_2H_2F_3$, $Si_2H_2F_4$, $Si_2H_3Cl_3$, $Si_2H_2Cl_4$ etc.

These silicon compounds may be used as a single compound or as a combination of two or more compounds.

As the compound containing carbon as the main skeleton, there may be employed, for example, chain or cyclic hydrocarbon compounds and chain or cyclic hydrocarbon compounds of which a part or all of the hydrogen atoms are substituted with halogen atoms, specifically saturated and unsaturated hydrocarbons represented by $C_nH_{2n+2}$ (n is an integer of 1 or more), $C_nH_{2n-2}$ (n is an integer of 1 or more), $C_nH_{2n}$ (n is an integer of 1 or more), or chain halogenated carbon represented by $C_uY_{2u+2}$ (u is an integer of 1 or more, Y is at least one element selected from F, Cl, Br and I), cyclic halogenated carbon represented by $C_vY_{2v}$ (v is an integer of 3 or more, Y has the above meaning), chain or cyclic carbon compounds represented by $C_uH_xY_y$ (u and Y have the above meanings, x+y=2u or 2u+2).

As hydrocarbon compounds, there may be included saturated hydrocarbons having 1 to 5 carbon atoms, ethylenic hydrocarbons having 2 to 5 carbon atoms, acetylenic hydrocarbons having 2 to 4 carbon atoms, including specifically, as saturated hydrocarbons. methane ($CH_4$), ethane ($C_2H_6$), propane ($C_3H_8$), n-butane (n-$C_4H_{10}$)pentane ($C_5H_{12}$)as ethylenic hydrocarbons, ethylene $C_2H_4$), propylene ($C_3H_6$), butene-1 ($C_4H_8$), butene-2 ($C_4H_8$), isobutylene ($C_4H_8$), pentene ($C_5H_{10}$);

as acetylenic hydrocarbons, acetylene ($C_2H_2$). methylacetylene ($C_3H_4$), butyne ($C_4H_6$), etc.

Specific examples may also include gaseous or readily gasifiable compounds such as $CF_4$, $(CF_2)_5$, $(CF_2)_6$, $(CF_2)_4$, $C_2F_6$, $C_3F_8$, $CHF_3$, $CH_2F_2$, $CCl_4$, $(CCl_2)_5$, $CBr_4$, $(CBr_2)_5$, $C_2Cl_6$, $C_2Br_6$, $CHCl_3$, $CH_2Cl_2$, $CHI_3$, $CH_2I_2$, $C_2Cl_3F_3$, $C_2H_3F_3$, $C_2H_2F_4$, etc.

These carbon compounds may be used either as a single compound or as a combination of two or more compounds.

As the compound containing germanium as the main skeleton, there may be employed, for example, chain or cyclic hydrogenated germanium compounds and chain or cyclic germanium compounds of which a part or all of hydrogen atoms are substituted with halogen atoms, specifically chain halogenated germanium represented by $Ge_uY_{2u+2}$ (u is an integer of 1 or more, Y is at least one element selected from F, Cl, Br and I), cyclic halogenated germanium represented by $G3_vY_{2v}$ (v is an integer of 3 or more, Y has the above meaning) and chain or cyclic compounds represented by $Ge_uH_xY_y$ (u and Y have the above meanings, $x+y=2u$ or $2u+2$).

Specific examples may include gaseous or readily gasifiable compound such as $GeH_4$, $Ge_2F_6GeF_4$, $(GeF_2)_5$, $(GeF_2)_6$, $(GeF_2)_4$, $Ge_2F_6$, $Ge_3F_8$, $GeHF_3$, $GeH_2F_2$, $GeCl_4$, $(GeCl_2)_5$, $GeBr_4$, $(GeBr_2)_5$, $Ge_2Cl_6$, $Ge_2Br_6$, $GeHCl_3$, $GeH_2Cl_2$, $GeHBr_3$, $GeHI_3$, $Ge_2Cl_3F_3$, $Ge_2H_3F_3$, $Ge_2H_2F_4$.

Also, in the present invention, as the impurity element to be used in formation of a deposited film controlled in valence electron, the p-type impurity may include elements of the group IIIA of the periodic table such as B, Al, Ga, In, Tl, etc., as preferable ones, and the n-type impurity the elements of the group VA of the periodic table such as P, As, Sb, Bi, etc., as preferable ones. Particularly, As, P and Sb are most preferred. The amount of the impurity to be used in doping may be determined suitably depending on the desired electrical and optical characteristics.

As the substance containing such impurity element as the component (substance for introduction of impurity), it is preferable to select a compound which is gaseous under normal temperature and normal pressure, or at least gaseous under the conditions for formation of a deposited film and can readily gasified by a convenient gasifying device. Examples of such compounds may include $PH_3$, $P_2H_4$, $PF_3$, $PF_5$, $PCl_3$, $AsH_3$, $AsF_3$, $AsF_5$, $AsCl_3$, $SbH_3$, $SbF_5$, $BF_3$, $BCl_3$, $BBr_3$, $B_2H_6$, $B_4H_{10}$, $B_5H_9$, $B_5H_{11}$, $B_6H_{10}$, $B_6H_{12}$, etc.

The compound containing impurity element may be used either singly or as a combination of two or more compounds.

The compound containing impurity element as the component may be either introduced directly under gaseous state or as a mixture with the starting gas for film formation into the film forming space.

In the present invention, the method for forming a deposited film doped with a valence electron controller is essentially different from that for formation of a deposited film having semiconductor characteristics not doped with a valence electron controller, but both deposited film forming means can be provided in the same deposited film forming device. In this case, when either one of the deposited film forming means is used, the other deposited film forming means is stopped.

Also, both of the above deposited film forming means can be provided adjacent to each other as separated by a gate valve, etc., whereby other deposited films can be formed continuously.

As the compound containing a band gap expanding element as the band gap regulator to be used in the present invention, there may be included carbon containing compounds, oxygen containing compounds, nitrogen containing compounds, etc.

Specifically, as the compound containing carbon, there may be employed, for example, chain or cyclic hydrocarbon compounds and chain or cyclic hydrocarbon compounds of which a part of all of the hydrogen atoms are substituted with halogen atoms, specifically saturated and unsaturated hydrocarbons represented by $C_nH_{2n+2}$ (n is an integer of 1 or more), $C_nH_{2n-2}$ (n is an integer of 1 or more), $C_nH_{2n}$ (n is an integer of 1 or more), or chain halogenated carbon represented by $C_uY_{2u+2}$ (u is an integer of 1 or more, Y is at least one element selected from F, Cl, Br and I), cyclic halogenated carbon represented by $C_vY_{2v}$ (v is an integer of 3 or more, Y has the above meaning), chain or cyclic carbon compounds represented by $C_uH_xY_y$ (u and Y have the above meanings, $X+Y=2u$ or $2u+2$).

As hydrocarbon compounds, there may be included saturated hydrocarbons having 1 to 5 carbon atoms, ethylenic hydrocarbons having 2 to 5 carbon atoms, acetylenic hydrocarbons having 2 to 4 carbon atoms, including specifically, as saturated hydrocarbons, methane ($CH_4$), ethane ($C_2H_6$), propane $C_3H_8$, n-butane (n-$C_4H_{10}$), pentane ($C_5H_{12}$); as ethylenic hydrocarbons, ethylene ($C_2H_4$), propylene $C_3H_6$, butene-1 ($C_4H_8$), butene-2 ($C_4H_8$), isobutylene ($C_4H_8$), pentene ($C_4H_8$); as acetylenic hydrocarbons, acetylene ($C_2H_2$), methylacetylene ($C_3H_4$), butyne ($C_4H_6$), etc.

Specific examples may also include gaseous or readily gasifiable compounds such as $CF_4$, $(CF_2)_5$, $(CF_2)_6$, $(CF_2)_4$, $C_2F_6$, $C_3F_8$, $CHF_3$, $CH_2F_2$, $CCl_4$, $(CCl_2)_5$, $CBr_4$, $(CBr_2)_5$, $C_2Cl_6$, $C_2Br_6$, $CHCl_3$, $CH_2Cl_2$, $CHI_3$, $CH_2I_2$, $C_2Cl_3F_3$, $C_2H_3F_3$, $C_2H_2F_4$, etc.

These carbon compounds may be used either as a single compound or as a combination of two or more compounds.

Examples of oxygen containing compounds may include compounds such as $O_2$, $CO_2$, NO, $NO_2$, $N_2O$, $O_3$, CO, $H_2O$, $CH_3OH$, $CH_3CH_2OH$, etc.

Examples of nitrogen containing compounds may include $N_2$, $NH_3$, $NH_2H_5N_3$, $N_2H_4$, $NH_4N_3$, etc.

On the other hand, compounds containing elements for reducing band gap as the band gap regulator may include germanium compounds, tin compounds, etc. as effective ones.

Specifically, as the compound containing germanium as the main skeleton, there may be employed, for example, chain or cyclic hydrogenated germanium compounds and chain or cyclic hydrogenated germanium compounds of which a part or all of hydrogen atoms are substituted with halogen atoms, specifically chain halogenated germanium represented by $Ge_uY2u+2$ (u is an integer of 1 or more, Y is at least one element selected from F, Cl, Br and I), cyclic halogenated germanium represented by $G3_vY_{2v}$ (v is an integer of 3 or more, Y has the above meaning) and chain or cyclic compounds represented by $Ge_uH_xY_y$ (u and Y have the above meanings, $x+y=2u$ or $2u+2$).

Specific examples may include gaseous or readily gasifiable compound such as $GeH_4$, $Ge_2H_6$, $GeF_4$, $(GeF_2)_5$, $(GeF_2)_6$, $(GeF_2)_4$, $Ge_2F_6$, $Ge_3F_8$, $GeHF_3$, $GeH_2F_2$, $GeCl_4$, $GeCl_2)_5$, $GeBr_4$, $(GeBr_2)_5$, $Ge_2Cl_6$, $Ge_2Br_6$, $GeHCl_3$, $GeH_2Cl_2$, $GeHBr_3$, $GeHI_3$, $Ge_2Cl_3F_3$, $Ge_2H_3F_3$, $Ge_2H_2F_4$, etc.

As the tin compounds, hydrogenated tin such as $SnH_4$ etc. may be included.

The method for forming a deposited film controlled in band gap is essentially different from that for formation of a deposited film not controlled in band gap, but both deposited film forming means can be provided in the same deposited film forming device. In this case, when either one of the deposited film forming means is used, the other deposited film forming means is stopped. Also, both of the above deposited film forming means can be connected to each other as separated by a gate valve, etc., whereby both deposited films can be formed continuously.

The substrate to be used in the present invention may be either electroconductive or electrically insulating, provided that it is selected as desired depending on the use of the deposited film formed. As the electroconductive substrate, there may be mentioned metals such as NiCr, stainless steel, A(, Cr, Mo, Au, Ir, Nb, Ta, V, Ti, Pt, Pd etc. or alloys thereof.

As insulating substrates, there may be conventionally be used films or sheets of synthetic resins, including polyester, polyethylene, polycarbonate, cellulose acetate, polypropylene, polyvinyl chloride, polyvinylidene chloride, polystyrene, polyamide, etc., glasses, ceramics, and so on. At least one side surface of these substrates is preferably subjected to treatment for imparting electroconductivity, and it is desirable to provide other layers on the side at which said electroconductive treatment has been applied.

For example, electroconductive treatment of a glass can be effected by providing a thin film of NiCr, Al, Cr, Mo, Au, Ir, Nb, Ta, V, Ti, Pt, Pd, $In_2O_3$, $SnO_2$, ITO ($In_2O_3 + SnO_2$) thereon. Alternatively, a synthetic resin film such as polyester film can be subjected to the electroconductive treatment on its surface by vacuum vapor deposition, electron-beam deposition or sputtering of a metal such as NiCr, Al, Ag, Pb, Zn, Ni, Au, Cr, Mo, Ir, Nb, Ta, V, Ti, Pt, etc., or by laminating treatment with said metal, thereby imparting electroconductivity to the surface. The substrate may be shaped in any form such as cylinders, belts, plates or others, and its form may be determined as desired.

The substrate should be preferably selected from among those set forth above in view of adhesion and reactivity between the substrate and the film. Further, if the difference in thermal expansion property between both is great, a large amount of strains may be created within the film to give sometimes no film of good quality, and therefore it is preferable to use a substrate so that the difference in thermal expansion property between both is small.

Also, the surface state of the substrate is directly related to the structure of the film (orientation) or generation of or a stylet structures, and therefore it is desirable to treat the surface of the substrate to give a film structure and a film texture so that desired characteristics may be obtained.

In the following, a suitable example of a device for embodying the present invention is described in detail by referring to the drawing.

First, FIG. 1 is a schematic constitutional illustration of a device for practicing the method for forming a thin film multi-layer structure of the present invention.

The deposited film forming device shown is broadly classified into a main device, an evacuation system and a gas feeding system.

In the main device, pipelines for gas introduction and a heat-generating member comprising a single substance or an alloy of a transition metal are provided.

101-108 are respectively bombs filled with the gases to be used during film formation, 101a-108a are respectively gas feeding pipes, 101b-108b are respectively mass flow controllers for controlling the flow rates of the gases from the respective bombs, 101c-108c are respectively gas pressure gauges, 101d-108d and 101e-108e are respectively valves, and 101f-108f are respectively pressure gauges indicating the pressures in the corresponding gas bombs.

120 is a vacuum chamber equipped at the upper portion with a pipeline for gas introduction, having a structure for formation of the reaction space downstream of the pipeline, and also having a structure for formation of a film forming space in which a substrate holder 112 is provided so that a substrate 118 may be provided as opposed to the gas discharging outlet of the pipelines. The pipeline for gas introduction has a triple concentric arrangement structure, having from the innerside a first gas introducing pipe 109 for introducing the gases from the gas bombs 101, 102, a second gas introducing pipe 110 for introducing the gases from the gas bombs 103-105, and a third gas introducing pipe 111 for introducing the gases from the gas bombs 106-108.

For gas evacuation to the reaction space of each gas introducing pipe, its position is designed so as to be arranged at a position farther from the surface position of the substrate as the pipe is nearer to the inner side. In other words, the gas introducing pipes are arranged so that the pipe on the outer side may enclose the pipe existing within the innerside thereof.

The gases from the respective bombs are fed into the respective introducing pipes through the gas feeding pipelines 123-125, respectively.

The respective gas introducing pipes, the respective gas feeding pipelines and the vacuum chamber 120 was evacuated to vacuum through the main vacuum valve 119 by means of a vacuum evacuation device not shown.

The substrate 118 is set at a suitable desired distance from the positions of the respective gas introducing pipes by moving vertically the substrate holder 112.

In the case of the present invention, the distance between the substrate and the gas discharging outlet of the gas introducing pipe may be determined appropriately in view of the kinds and the desired characteristics of the deposited film formed, the gas flow rates, the inner pressure in the vacuum chamber, etc., but it is preferably several mm to 20 cm, more preferably 5 mm to about 15 cm.

113 is a heater for heating the substrate which is provided in order to heat the substrate to an appropriate temperature during film formation, or preheating the substrate 118 before film formation, or further to anneal the film after film formation.

The substrate heating heater 113 is supplied with power through a conductive wire 114 from a power source 115.

116 is a thermocouple for measuring the temperature of the substrate (Ts) and is electrically connected to the temperature display device 117.

By use of such a deposited film forming device, according to the method for forming a thin film multi-layer structure member, the methods for preparing a thin film transistor (hereinafter referred to as TFT), a solar battery and an image forming member for electrophotography are described in detail below.

EXAMPLE 1

Figure 2:
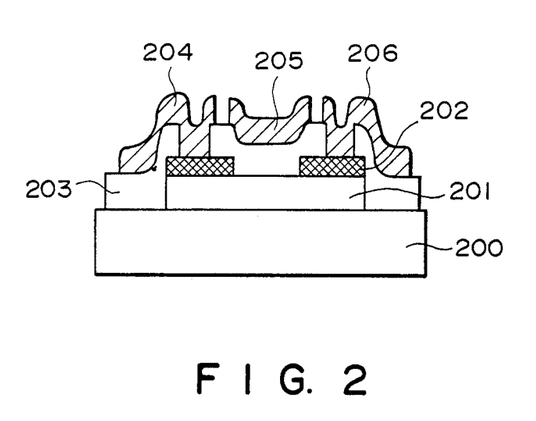
FIG. 2 illustrates schematically the constitution of the thin film transistor prepared utilizing the method of the present invention.

FIG. 2 illustrates schematically the constitution of the TFT prepared according to a first example of the present invention.

TFT in FIG. 2 is constituted of a glass substrate 200, a first layer 201 (amorphous silicon, thickness 7000Å, a second layer 202 (amorphous silicon doped with phosphorus to high concentration, thickness 500Å), a third layer 203 (silicon oxide, thickness 1000Å), Al electrodes 204, 205 and 206. In the following, the methods for forming respective layers are described.

First, the second layer 202 of the amorphous silicon doped with phosphorus to high concentration is formed as follows.

$Si_2F_6$ gas in the bomb 102 was introduced at a flow rate of 15 SCCM through the gas introducing pipe 109, $PH_3/H_2$ gas (PH3 concentration 1000 ppm) in the bomb 103 at a flow rate of 3 SCCM through the gas introducing pipe 110 and $H_2$ gas in the bomb 107 at a flow rate of 5 SCCM through the gas introducing pipe 111 respectively into the vacuum chamber 120, and the tungsten filament 126 was heated to about 2000° C. to form a second layer 202 of the amorphous silicon doped with phosphorus to a high concentration. During this operation, the substrate temperature was set at 250° C. and the distance between the filament 126 and the substrate 118 was set at 20 mm.

The first layer 201 of amorphous silicon and the third layer 203 of silicon oxide were deposited by mixing and reacting a gaseous starting material for formation of a deposited film with a gaseous halogenic oxidizing agent having oxidation action for the starting material in the vacuum chamber 120.

For deposition of the first layer 201 of amorphous silicon, $SiH_4$ gas filled in the bomb 101 was introduced at a flow rate of 25 SCCM through the gas introducing pipe 109, $F_2$ gas filled in the bomb 106 at a flow rate of 15 SCCM and He gas filled in the bomb 107 at a flow rate of 150 SCCM through the gas introducing pipe 111 into the vacuum chamber 120.

During this operation, the pressure within the vacuum chamber 120 was made 0.8 Torr by controlling the opening of the vacuum valve 119. The distance between the gas introducing inlet 111 and the substrate was set at 3 cm. Blueish white luminescence was strongly observed in the mixing region of $SiH_4$ gas and $F_2$ gas.

For deposition of the third layer 203 of silicon oxide, $SiH_4$ gas filled in the bomb 101 was introduced at a flow rate of 15 SCCM through the gas introducing pipe 109, $N_2O$ gas filled in the bomb 106 at a flow rate of 3 SCCM and He gas filled in the bomb 107 at a flow rate of 25 SCCM through the gas introducing pipe 111 into the vacuum chamber 120.

During this operation, the pressure within the vacuum chamber 120 was made 0.3 Torr by controlling the opening of the vacuum valve 119.

The substrate temperature during deposition of the above first layer 201 and the third layer 203 was set at 250° C. Subsequently, the gate electrode 205 and source and drain electrodes 204 and 206 were formed to complete the TFT. The TFT obtained was found to be improved in ON/OFF resistance ratio by about 15% as compared with the product of the prior art.

EXAMPLE 2

Figure 3:
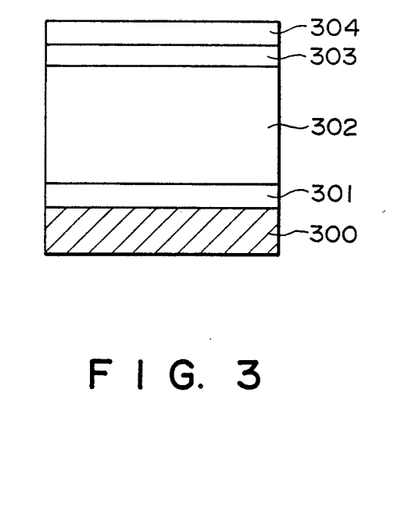
FIG. 3 illustrates schematically the constitution of the solar battery utilizing the method of the present invention.

FIG. 3 illustrates schematically the constitution of the solar battery prepared according to a second Example of the present invention.

The solar battery shown in FIG. 3 is constituted of a glass substrate 300 having a transparent electrode vapor deposited thereon, a first layer 301 (p-type amorphous silicon, thickness 500Å), a second layer 302 (i-type amorphous silicon, thickness 1 μm), a third layer 303 (n-type amorphous silicon, thickness 500Å), and an Al electrode 304.

The first layer 301 was formed according to the same procedure by use of the same filament as used in Example 1 except that the tungsten filament 126 used in Example 1 was exchanged with a platinum filament 126.

Also, the second layer 302 and the third layer 303 were deposited according to the same gas contact method as in Example 1, namely by mixing and reacting a gaseous starting material for formation of a deposited film with a gaseous halogenic oxidizing agent having the property of oxidation action of the starting material in the vacuum chamber 120.

The film forming conditions according to this Example are shown in Table 1.

The solar battery thus obtained exhibited a conversion efficiency which was higher by 20% than the product of the prior art.

TABLE 1

| | (Substrate temperature 250° C.) | | | |
|---|---|---|---|---|
| Layer | Starting Materials | Flow rate (SCCM) | Deposition Method | Pressure (Torr) |
| First layer (p-type) | $SiH_2F_2$ | 15 | Platinum filament Thermal dissociation method (2000° C.) | 0.3 |
| | $B_2H_6/H_2$ (= 1000 ppm) | 5 | | |
| | $H_2$ | 10 | | |
| Second layer (i-type) | $SiH_4$ | 25 | FOCVD method | 0.7 |
| | $F_2$ | 20 | | |
| | He | 200 | | |
| Third layer (n-type) | $SiH_4$ | 15 | FOCVD method | 0.5 |
| | $PH_3/He$ (= 1000 ppm) | 3 | | |
| | $F_2$ | 15 | | |
| | He | 100 | | |

EXAMPLE 3

Figure 4:
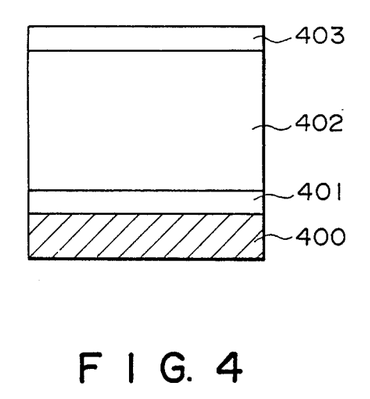
FIGS. 4 and 5 each illustrate schematically the constitution of the image forming member for electrophotography prepared utilizing the method of the present invention.

FIG. 4 illustrates schematically the constitution of the image forming member for electrophotography prepared according to a third Example of the present invention.

The image forming member shown in FIG. 4 is constituted of an Al substrate 400, a first layer 401 (charge injection preventing layer of amorphous silicon doped with boron, thickness 0.5 μm), a second layer 402 (a photoconductive layer of amorphous silicon, thickness 18 μm), third layer 403 (surface protective layer of amorphous silicon carbide, thickness 0.1 μm). Such an image forming member for electrophotography was prepared according to the same procedure as in Example under the film forming conditions shown in Table 2. As a result, an image forming member improved in charging characteristic by 25% or higher and also reduced in the number of image defects by about 12% as compared with the prior art was obtained.

TABLE 2

(Substrate temperature 280° C.)

| Layer | Starting Materials | Flow rate (SCCM) | Deposition Method | Pressure (Torr) |
|---|---|---|---|---|
| First layer (p-type) | $SiH_4$ | 10 | | 0.3 |
| | $B_2H_6/H_2$ (= 1000 ppm) | 3 | Tungsten mesh Thermal dissociation method (2000° C.) | |
| | $N_2O$ | 5 | | |
| | $H_2$ | 15 | | |
| Second layer (i-type) | $SiH_4$ | 120 | FOCVD method | 1.0 |
| | $F_2$ | 100 | | |
| | He | 250 | | |
| Third layer (a-SiC) | $Si_2H_3F_3$ | 15 | Tungsten mesh Thermal dissociation method | 0.4 |
| | $CH_4$ | 100 | | |
| | $H_2$ | 10 | | |

EXAMPLE 4

The solar battery prepared according to this Example has the same layer constitution as that of the solar battery schematically shown in FIG. 3.

In FIG. 3, on the glass substrate 300 are formed a transparent electrode (not shown), a p-type amorphous silicon carbide layer 301 (first layer thickness 300Å), an i-type amorphous silicon layer 302 (second layer, thickness 1 μm), a n-type amorphous silicon layer 303 (third layer, thickness 300Å) and an Al electrode 304 by lamination.

In depositing the p-type silicon carbide layer 301, $Si_2F_6$ gas in the bomb 102 was introduced at a flow rate of 15 SCCM through the gas introducing pipe 109, $B_2H_6/H_2$ gas ($B_2H_6$ concentration 1000 ppm) in the bomb 103 at a flow rate of 5 SCCM and $CH_4$ gas in the bomb 105 at a flow rate of 60 SCCM respectively through the gas introducing pipe 110, and $H_2$ gas in the bomb 107 at a flow rate of 15 SCCM through the gas introducing pipe 111 into the vacuum chamber 120, respectively, and a p-type amorphous silicon carbide layer 301 expanded in band gap with carbon was formed by heating the tungsten filament 126 to about 1800° C. The distance between the filament 126 and the substrate 118 was made 20 mm and the substrate temperature was set at 250° C.

The i-type amorphous silicon layer 302 and the n-type amorphous silicon layer 303 were deposited by mixing and reacting the gaseous starting material for formation of a deposited film with the gaseous halogenic oxidizing agent having the property of oxidation action for the starting material in the vacuum chamber 120.

That is, in formation of the i-type amorphous silicon layer 302, $Si_4$ gas filled in the bomb 101 was introduced at a flow rate of 25 SCCM through the gas introducing pipe 109, $F_2$ gas filled in the bomb 106 at a flow rate of 20 SCCM and He gas filled in the bomb 107 at a flow rate of 80 SCCM through the gas introducing pipe 111 into the vacuum chamber 120.

During this operation, the pressure in the vacuum chamber 120 was made 0.7 Torr by controlling the opening of the vacuum valve 119, and the distance between the gas introducing outlet 111 and the substrate was set at 3 cm. Blueish white luminescence was strongly observed in the mixing region of $Si_4$ gas and $F_2$ gas.

In formation of the n-type amorphous silicon layer 303, $SiH_4$ gas filled in the bomb 101 was introduced at a flow rate of 15 SCCM through the gas introducing pipe 109, $PH_3/He$ ($PH_3$ concentration 1000 ppm) filled in the bomb 104 at a flow rate of 5 SCCM through the gas introducing pipe 110, $F_2$ gas filled in the bomb 106 at a flow rate of 12 SCCM and He gas filled in the bomb 107 at a flow rate of 70 SCCM through the gas introducing pipe 111 into the vacuum chamber 120. During this operation, the pressure in the vacuum chamber 120 was made 0.4 Torr by controlling the opening of the vacuum valve 119.

In formation of the respective layers, the substrate temperature was set at 250° C.

The solar battery thus obtained exhibited a photoelectric conversion efficiency higher by 22% as compared with the product of the prior art.

EXAMPLE 5

Figure 5:
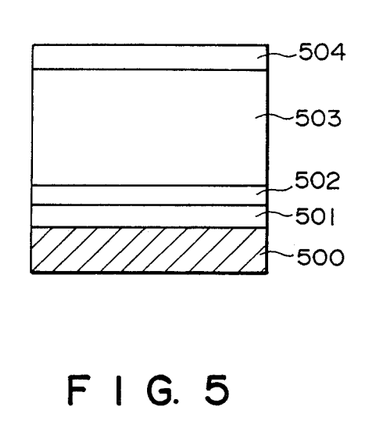

The image forming member for electrophotography prepared according to this Example has the same layer constitution as that of the image forming member schematically shown in FIG. 5.

In FIG. 5, on the aluminum substrate 500 are formed a light reflection preventing layer 501 (first layer, amorphous silicon germanium layer controlled in band gap with Ge, thickness 0.3 μm), a charge injection preventing layer 502 (second layer, amorphous silicon layer doped with B, Thickness 0.4 μm), a photosensitive layer 503 (third layer, amorphous silicon layer, thickness 18 μm), a surface protective layer 504 (fourth layer, amorphous silicon carbide layer controlled in bang gap with C, thickness 0.2 μm) by lamination.

The image forming member as mentioned above was prepared by use of the deposited film forming device as shown in Example 4 under the film forming conditions shown in Table 3. However, in the deposition method in Table 3, "tungsten mesh (1800° C.)" indicates the method in which a mesh-shaped heat-generating member is used in place of the filament 126 in Example 3, "gas contact method" indicates the method in which the gaseous starting material (a) for formation of a deposited film and the gaseous halogenic oxidizing agent having the property of oxidation action for the starting material are mixed and reacted with each other in the vacuum chamber 120 similarly as in Example 3.

As a result, the charging characteristic was found to be improved by 20% as compared with the prior art, and also image defect number reduced by about 10% and sensitivity enhanced by 18% or more.

TABLE 3

| Layer | Starting Materials | Flow Rate (SCCM) | Deposition method | Pressure (Torr) |
|---|---|---|---|---|
| First layer a-Si:Ge:B:H:F | $Si_2H_3F_3$ | 20 | Thermal dissociation method | 0.3 |
| | $B_2H_6/He$ (1000 ppm) | 5 | | |
| | $GeH_4$ | 5 | Tungsten mesh (1800° C.) | |
| | $H_2$ | 10 | | |
| Second layer | $Si_2H_3F_3$ | 15 | Thermal dissociation | 0.3 |

TABLE 3-continued

| Layer | Starting Materials | Flow Rate (SCCM) | Deposition method | Pressure (Torr) |
|---|---|---|---|---|
| (p-type) a-Si:H:F:N:O:B | $B_2H_6$/He (1000 ppm) $N_2O$ $H_2$ | 4 5 10 | method Tungsten mesh (1800° C.) | |
| Third layer (i-type) | $SiH_4$ $F_2$ He | 100 80 200 | FOCVD method | 0.8 |
| Fourth layer a-Si:C:H:F | $SiH_4$ $C_2H_4$ $F_2$ He | 10 60 10 50 | FOCVD method | 0.5 |

EXAMPLE 6

The TFT prepared according to this Example has the same layer constitution as that of TFT schematically shown in FIG. 2.

In FIG. 2, on the glass substrate 200 are formed an amorphous silicon layer 201 (first layer thickness 6000Å), an amorphous silicon layer 402 doped with phosphorus to a high concentration (second layer thickness 700Å), an insulating layer 203 (third layer thickness 2000Å) and an Al gate electrode 205, source and drain electrodes 204, 206.

The TFT as described above was prepared by use of the deposited film forming device as shown in Example 4 under the conditions shown in Table 4.

The TFT prepared by this Example was found to be improved in ON/OFF resistance ratio by about 15% as compared with the product of the prior art.

TABLE 4

(Substrate temperature 300° C.)

| Layer | Starting Materials | Flow rate (SCCM) | Deposition Method | Pressure (Torr) |
|---|---|---|---|---|
| First layer | $SiH_4$ $F_2$ He | 25 20 150 | FOCVD method | 0.3 |
| Second layer | $SiH_4$ $PH_3/H_2$ (1000 ppm) $F_2$ $H_2$ | 20 4 20 10 | FOCVD method | 0.3 |
| Third layer | $SiH_2F_2$ $C_2H_4$ $H_2$ He | 15 40 50 100 | Platinum filament Thermal dissociation method (1800° C.) | 0.6 |

As described in detail above, the thin film multi-layer structure member prepared according to the present invention is improved in interface characteristics and therefore semiconductor devices having excellent characteristics as shown by above respective Examples.

Also, the method for forming a thin film multi-layer structure member according to the present invention effects conservation of energy and at the same time gives deposited films having uniform physical characteristics over large area with easy management of film quality. Also, it is possible to obtain easily multi-layer constitution excellent in productivity, bulk productivity, having high quality with excellent physical properties such as electrical, optical and semiconductor properties, etc.

We claim:

1. A method for forming a thin film multi-layer structure member having at least one semiconductor thin film controlled in valence electron or one semiconductor thin film regulated in band gap, which comprises:
   energizing a heat-generating member provided in a film-forming space housing a substrate to generate heat; said heat-generating member comprising a metal or alloy of a transition metal;
   bringing a gaseous starting material (A) for deposited film formation and a gaseous compound (B) into contact with the heat-generating member under heat generating state to cause a catalytic thermal dissociation reaction to thereby form a precursor (X); said starting material (A) containing hydrogen or a halogen; said compound (b) containing an element capable of being an electron controller or a band gap regulator; and
   forming on said substrate a deposited thin film from said precursor (X);
   introducing a gaseous starting material (A) for deposited film formation and a gaseous halogenic oxidizing agent into a reaction space to effect an oxidation reaction therebetween to thereby form a plurality of precursors including precursors in an excited state; and
   forming on said substrate in said film-forming space a thin film from at least one of said precursors.

2. The method according to claim 1, wherein the gaseous starting material (a) is selected from chain silane compounds, cyclic silane compounds, chain germanium compounds and hydrogenated tin.

3. The method according to claim 1, wherein the gaseous halogenic oxidizing agent is selected from $F_2$, $Cl_2$, $Br_2$ and $I_2$.

4. The method according to claim 1, wherein the gaseous halogenic oxidizing agent is selected from fluorine, chlorine and bromine under nascent state.

5. The method according to claim 1, wherein the ratio of the amount of the gaseous starting material (a) and the amount of the gaseous halogenic oxidizing agent introduced into the reaction space is 1/20–100/1.

6. The method according to claim 1, wherein the film forming space and the reaction space is one and the same space.

7. The method according to claim 1, wherein the transition metal is selected from among Ti, Nb, V, Cr, Mo, W, Fe, Zr, Hf, Ta, Ni, Co, Rh, Pt, Pd, Au, Mn, Ag, Zn and CD.

8. The method according to claim 1, wherein the alloy of the transition metal is Pd-Ag or Ni-Cr.

9. The method according to claim 1, wherein the starting material (A) is selected from (a) $SiF_4$, $(SiF_2)_5$, $(SiF_2)_6$, $(SiF_2)_4$, $Si_2F_6$, $Si_3F_8$, $SiHF_3$, $SiH_2F_2$, $SiCl_4$, $(SiCl_2)_5$, $SiBr_4$, $(SiBr_2)_5$, $Si_2Cl_6$, $Si_2Br_6$, $SiHCl_3$, $SiH_2Cl_2$, $SiHBr_3$, $SiHI_3$, $Si_2Cl_3F_3$, $Si_2H_3F_3$, $Si_2H_2F_4$, $Si_2H_3Cl_3$ and $Si_2H_2Cl_4$;

(b) $CF_4$, $(CF_2)_5$, $(CF_2)_6$, $(CF_2)_4$, $C_2F_6$, $C_3F_8$, $CHF_3$, $CH_2F_2$, $CCl_4$, $(CCl_2)_5$, $CBr_4$, $(CBr_2)_5$, $C_2Cl_6$, $C_2Br_6$, $CHCl_3$, $CH_2Cl_2$, $CHI_3$, $CH_2I_2$, $C_2Cl_3F_3$, $C_2H_3F_3$ and $C_2H_2F_4$; and (c) $GeH_4$, $Ge_2F_6$, $GeF_4$, $(GeF_2)_5$, $(GeF_2)_6$, $(GeF_2)_4$, $Ge_2F_6$, $Ge_3F_8$, $GeHF_3$, $GeH_2F_2$, $GeCl_4$, $(GeCl_2)_5$, $GeBr_4$, $GeBr_2)_5$, $Ge_2Cl_6$, $Ge_2Br_6$, $GeHCl_3$, $GeH_2Cl_2$, $GeHBr_3$, $GeHI_3$, $Ge_2Cl_3F_3$, $Ge_2H_3F_3$ and $Ge_2H_2F_4$.

10. The method according to claim 1, wherein the compound (B) is selected from (d) $PH_3$, $P_2H_4$, $PF_3$, $PF_5$, $PCl_3$, $AsH_3$, $AsF_3$, $AsF_5$, $AsCl_3$, $SbH_3$, $SbF_5$, $BF_3$, $BCl_3$, $BBr_3$, $B_2H_6$, $B_4H_{10}$, $B_5H_9$, $B_5H_{11}$, $B_6H_{10}$ and $B_6H_{12}$;

(e) $CF_4$, $(CF_2)_5$, $(CF_2)_6$, $(CF_2)_4$, $C_2F_6$, $C_3F_8$, $CHF_3$, $CH_2F_2$, $CCl_4$, $(CCl_2)_5$, $CBr_4$, $(CBr_2)_5$, $C_2Cl_6$, $C_2Br_6$, $CHCl_3$, $CH_2Cl_2$, $CHI_3$, $CH_2I_2$, $C_2Cl_3F_3$, $C_2H_3F_3$ and $C_2H_2F_4$;

(f) $O_2$, $CO_2$, $NO$, $NO_2$, $N_2O$, $O_3$, $CO$, $H_2O$, $CH_3OH$ and $CH_3CH_2OH$; and (g) $SnH_4$.

* * * * *

UNITED STATES PATENT AND TRADEMARK OFFICE
CERTIFICATE OF CORRECTION

PATENT NO. : 4,868,014
DATED : September 19, 1989
INVENTOR(S) : MASAHIRO KANAI, ET AL.   Page 1 of 5

It is certified that error appears in the above-identified patent and that said Letters Patent is hereby corrected as shown below:

IN [57] ABSTRACT

Line 9, "catalystic" should read --catalytic--.
    Line 12, "halogens" should read --halogen--.

COLUMN 1

Line 49, "were" should read --are--.
    Line 50, "Besides, the parameters" should read
        --Besides the parameters,--.
    Line 56, "best" should read --best method--.

COLUMN 2

Line 6, "in" should read --is--.
    Line 9, "non-uniformization" should read
        --non-uniformity--.
    Line 51, "forming" should read --forming a--.

COLUMN 4

Line 1, "character-istics," should read
        --characteristics,--.
    Line 11, "carrie gas" should read --carrier gas--.
    Line 56, "a" should be deleted.
    Line 60, "tion" should read --tions--.

COLUMN 5

Line 3, "lower," should read --low,--.
    Line 6, "deposit" should read --deposited--.
    Line 35, "pressure" should read --pressures--.

UNITED STATES PATENT AND TRADEMARK OFFICE
CERTIFICATE OF CORRECTION

PATENT NO. : 4,868,014

DATED : September 19, 1989

INVENTOR(S) : MASAHIRO KANAI, ET AL.

It is certified that error appears in the above-identified patent and that said Letters Patent is hereby corrected as shown below:

COLUMN 6

Line 41, "molecule" should read --molecules--.
    Line 57, ".H," should read --·H,--.

COLUMN 8

Line 3, "hone/comb etc.," should read --honeycomb etc.,--.
    Line 24, "as" should read --as a--.
    Line 25, "compounds," should read --compound,--.
    Line 26, "compounds," should read --compound,--.
    Line 27, "as" should read --as a-- and "compounds," should read --compound,--.
    Line 40, "$SiHI_3$," should read --$SiHI_3$, $Si_2Cl_3F_3$,-- and "$Si_2H_2F_3$," should be deleted.
    Line 64, "hydrocarbons." should read --hydrocarbons,--.
    Line 66, "(n-$C_4H_{10}$)pentane ($C_5H_{12}$)" should read --(n-$C_4H_{10}$), pentane ($C_5H_{12}$);--.
    Line 67, "ethylene $C_2H_4$)" should read --ethylene ($C_2H_4$)--.

COLUMN 9

Line 1, "acetylene ($C_2H_2$)." should read --acetylene ($C_2H_2$),--.
    Line 5, "($CCl_2$)$_5$)," should read --($CCl_2$)$_5$,--.
    Line 19, "$G3_vY_{2v}$" should read --$Ge_vY_{2v}$--.
    Line 24, "compound" should read --compounds--.
    Line 45, "can" should read --can be--.

UNITED STATES PATENT AND TRADEMARK OFFICE
CERTIFICATE OF CORRECTION

PATENT NO. : 4,868,014
DATED : September 19, 1989
INVENTOR(S) : MASAHIRO KANAI, ET AL.

It is certified that error appears in the above-identified patent and that said Letters Patent is hereby corrected as shown below:

COLUMN 10

Line 22, "X + Y = 2u or 2u + 2)." should read --x + y = 2u or 2u + 2).--.
Line 30, "propylene $C_3H_6$)," should read --propylene ($C_3H_6$),--.
Line 31, "pentene ($C_4H_8$);" should read --pentene ($C_5H_{10}$);--.
Line 46, "$NH_2H_5N_3$," should read --$N_2H_5N_3$,--.
Line 61, "$G3_vY_{2v}$" should read --$Ge_vY_{2v}$--.
Line 66, "compound" should read --compounds--.
Line 68, "$GeCl_2)_5$," should read --$(GeCl_2)_5$,--.

COLUMN 11

Line 21, "A(," should read --Al,--.
Line 25 "be" should be deleted.
Line 58, "or a" should be deleted.

COLUMN 12

Line 41, "was" should read --were--.

COLUMN 13

Line 11, "7000 Å," should read --7000 Å),--.
Line 22, "(PH3 concentration" should read --($PH_3$ concentration--.

Page 3 of 5

UNITED STATES PATENT AND TRADEMARK OFFICE
CERTIFICATE OF CORRECTION

PATENT NO. : 4,868,014
DATED : September 19, 1989
INVENTOR(S) : MASAHIRO KANAI, ET AL.

It is certified that error appears in the above-identified patent and that said Letters Patent is hereby corrected as shown below:

COLUMN 14

Line 63-64, "as in Example" should read
--as in Example 1--.

COLUMN 15

Line 28, "a n-type" should read --an n-type--.
Line 54, "$Si_4$ gas" should read --$SiH_4$ gas--.

COLUMN 16

Line 8, "$Si_4$ gas" should read --$SiH_4$ gas--.
Line 36, Close up right margin.
Line 37, Close up left margin.
Line 42, "bang gap" should read --band gap--.

COLUMN 17

Line 54, "therefore" should read --therefore obtain--.

COLUMN 18

Line 29, "compound (b)" should read --compound (B)--.
Line 34, "gaseous starting material (A)" should read
--gaseous starting material (a)--.
Line 56, "film" should read --film- --.
Line 62, "CD." should read --Cd.--.
Line 67, "$Si_2F_6$." should read --$Si_2F_6$,--.

UNITED STATES PATENT AND TRADEMARK OFFICE
CERTIFICATE OF CORRECTION

PATENT NO. : 4,868,014
DATED : September 19, 1989
INVENTOR(S) : MASAHIRO KANAI, ET AL.

It is certified that error appears in the above-identified patent and that said Letters Patent is hereby corrected as shown below:

COLUMN 19

Line 10, "$GeBr_2)_5$," should read --$(GeBr_2)_5$,--.

COLUMN 20

Line 7, "$C_2C_{16}$," should read --$C_2Cl_6$,--.

Signed and Sealed this

Twenty-ninth Day of December, 1992

Attest:

DOUGLAS B. COMER

Attesting Officer　　　　Acting Commissioner of Patents and Trademarks